INVENTORS.
ROBERT SAMSON
GEORGE J. SPRENKLE
Carl Fissell Jr.
AGENT

INVENTORS.
ROBERT SAMSON
GEORGE J. SPRENKLE

Carl Fissell Jr
AGENT

April 23, 1968 R. SAMSON ETAL 3,380,016

ELECTRONIC CIRCUIT PACKAGE STORAGE, FORMING AND HANDLING APPARATUS

Filed May 3, 1965 3 Sheets-Sheet 3

INVENTORS.
ROBERT SAMSON
GEORGE J. SPRENKLE

Carl Fissell Jr.
AGENT

United States Patent Office 3,380,016

Patented Apr. 23, 1968

3,380,016

ELECTRONIC CIRCUIT PACKAGE STORAGE, FORMING AND HANDLING APPARATUS

Robert Samson, Wayne, and George J. Sprenkle, Phoenixville, Pa., assignors to Burroughs Corporation, Detroit, Mich., a corporation of Michigan Filed May 3, 1965, Ser. No. 452,807
9 Claims. (Cl. 339—174)

ABSTRACT OF THE DISCLOSURE

The present invention provides a pair of box-like interfitting, internestable rigid structural members forming a container adapted to receive a miniature electronic circuit flat-pack therein and having integral oppositely disposed members engageable with the circuit connecting ribbon leads of the flat-pack effective to bend and form the ribbon leads into substantially rigid contact prongs or projections for pluggable reception within and electrical contact to printed wiring circuit assemblies or other similar utilization devices with which the flat-pack circuit may be operably associated.

The present invention relates to storage, forming and handling apparatus for electronic circuit packages and, more particularly, although not necessarily exclusively, to novel apparatus for supporting, shaping and attaching the lead conductors of subminiature electronic circuit packages to electrical printed wiring circuitry or other utilization devices.

Miniature and subminiature integrated electronic circuits, etc., are packaged in extremely small and difficult to handle structures. The conductive busses or leads which normally extend away therefrom are relatively thin, flexible and easily damaged. These attachment elements cannot withstand rough handling as for example, during packaging, shipping and/or circuit fabrication and assembly.

Conventional practice utilizes a wide variety of relatively expensive and highly specialized handling formats in order to accommodate the different integrated circuit assemblies. Since most of the circuit assemblies are developed for use in printed wiring apparatus, it is desirable to provide means for accommodating such subminiature packages and their associated lead wires in a structural assembly which is sufficiently rigid, solid and indestructible to prevent stress build-up and/or damage to the components within the package. Such means preferably should be of a type which does not require specially designed or sophisticated tools, handling devices or supporting assemblies, etc.

It is an important object therefore of the present invention to provide a unitary supporting and handling structure which solves the foregoing problems in a new, novel and heretofore unknown manner.

Another object of the invention is to provide apparatus which is capable of effectively storing, forming and attaching integrated circuit assemblies to printed wiring apparatus with which the former may be associated.

Still another object of the invention is to provide means for forming and shaping the conductive leads of subminiature electronic circuit packages for suitable attachment to devices with which the same may be employed.

It is also an object of the invention to provide a combined integrated circuit mounting and lead forming device with heat sink and shock mounting structures thus effectively eliminating failures due to temperature and/or shock as a result of handling, assembling or operation of the device.

In accordance with the foregoing objects and first briefly described, the present invention comprises, a pair of interfitting members, one of which acts in the nature of a container for subminiature electrical or electronic circuit components having thin ribbon-like leads extending therefrom while the other member of the pair acts in the nature of a closure member, cap or cover for the container. The container member is shaped to receive interfitting portions of the closure member in such manner as to bend and form the ribbon leads, of the circuit package contained therein, into substantially rigid, contact prongs or projections for pluggable reception within a printed wiring circuit assembly or other devices with which the latter may be associated. Resilient and deformable means is provided as a part of the two-part assembly for shock mounting and heat sinking the contents of the apparatus. The structure may then be hermetically encapsulated as by a dipping, painting, spraying or otherwise coating and covering the assembly with a dielectric material, thus providing a unitary assembly which is simply, easily and efficiently handled without danger of failure due to shock, temperature change or other mishandling.

For a better understanding of the present invention, together with further objects, advantages and features thereof, reference is made to the following description and accompanying drawings, in which.

Figure 1:
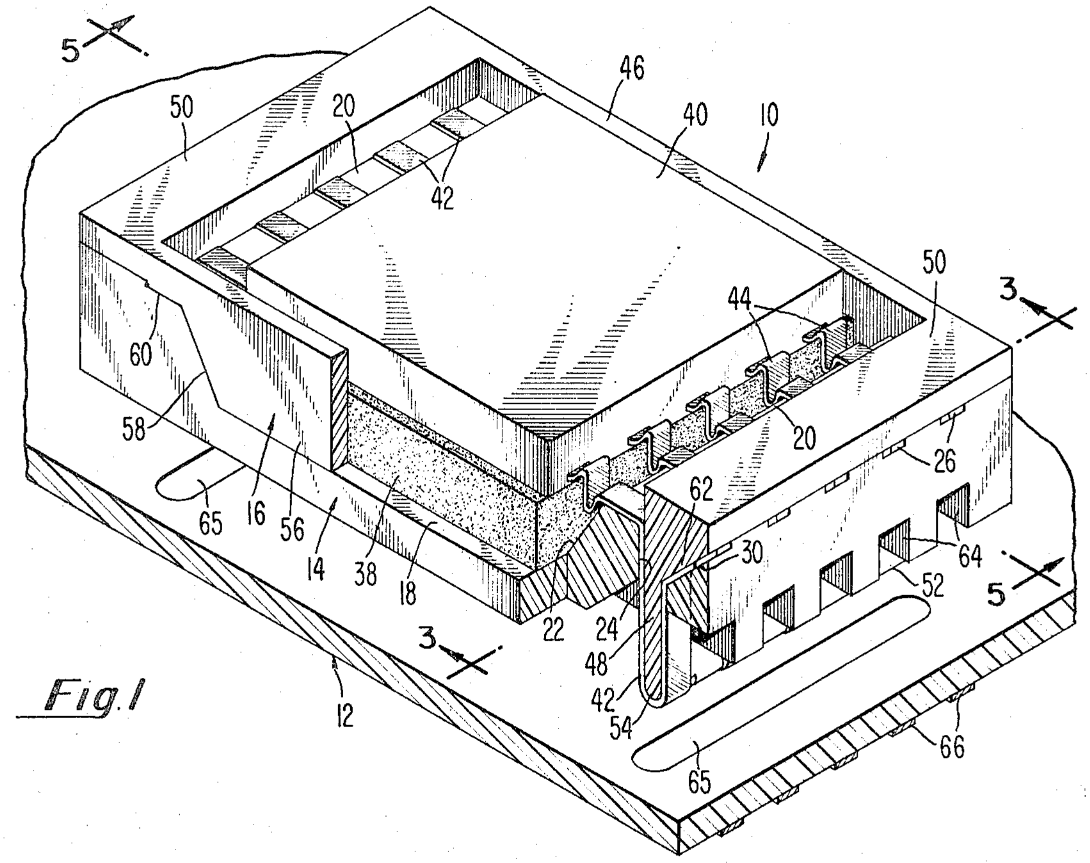
FIGURE 1 is an isometric partially sectionalized view of a preferred embodiment of the present invention.

As seen more particuarly in FIGURE 1 of the drawings, a preferred and illustrated embodiment of the present invention comprises, apparatus hereinafter characterized as a pluggable header 10 for demountable, interfitting or nesting engagement e.g., with a printed wiring circuit, panel or board 12, with which the former may be operably associated. The header assembly 10 is of two-part construction and includes a (lower) base member 14 and an (upper) demountable cap or closure member 16. The construction of these and associated parts of the apparatus will first be described and thereafter an operational assembly description will follow so that the use to which the device is or may be put may be clearly understood.

Figure 2:
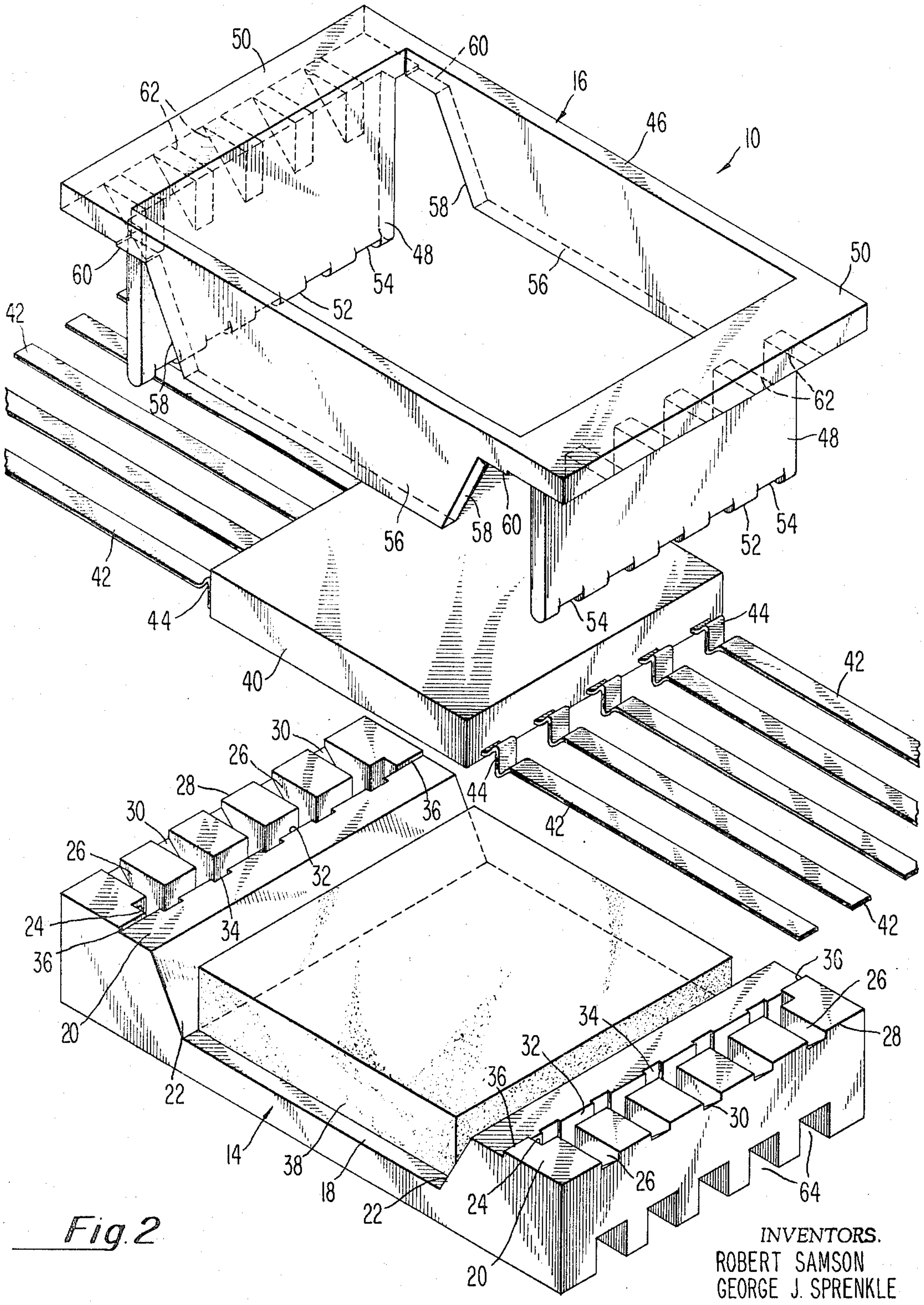
FIGURE 2 is an exploded isometric view illustrating the manner in which the various portions of the structure are assembled together.

The relative size, shape and physical displacement of each of the associated structures of the invention is seen most clearly in the exploded isometric view of FIGURE 2. The upper and lower members 16 and 14 respectively, are or may be formed as by casting, molding, etc., from any suitable high temperature dielectric plastic material such for example, as phenolic diallylpthalate, glass filled epoxy, silicone molding resin, molding epoxy, etc.

The lower or base member 14 is provided with a central substantially flat, rectangular depressed area 18 forming a relatively flat platform for purposes to be described later on herein, intermediate opposite end lands or mesas 20. The confronting inner walls of the mesas 20 slope upwardly and outwardly from the floor of the area 18 at a slight angle as indicated at 22. Each of the mesas 20—20 is provided with a transverse aperture or slot 24 extending substantially across the width of the member 14 terminating slightly inboard of the opposite parallel edges thereof, as seen more clearly in FIGURE 2. Arranged at right angles to each slot 24—24 are a plurality of rectangular notches 26, molded or otherwise formed in the base member. The base, bottom or floor of each of the notches 26—26 is canted or sloped downwardly from opposite external edges 28 at a slight angle, as indicated at 30, for purposes to be described later on.

The inner, vertical wall 32, of each mesa 20 is provided with a shallow, vertically extending notch 34 arranged in register with the notch 26 and adjacent thereto. A registration ledge 36 is formed in each mesa 20 as by milling, molding, etc., for purposes still to be described herein.

Shock and impact absorbing means 38 is receivable in the area 18 of the base member 14. This compression pad can be formed of foamed polyurethane, sponge or synthetic rubber, or other similar shock and impact resistant material, for example, .093 thick, which can be ahesively secured within the area provided therefor.

Electronic circuit modules 40 take many shapes and forms and are fabricated in a variety of sizes, weights and thicknesses. Each manufacturer provides a circuit or circuits which perform certain desired functions, for example, amplifiers, counters, registers, memory storage, etc. Each of these electronic circuit assemblies necessarily includes one or more conductive leads 42 extending away therefrom for interconnection to a utilization device and/or to a source of electrical energizing potential. These so-called "chips" or "flat-packs" 40 are extremely small ceramic or Kovar bodies ¼" x ¼", .06 thick with extremely thin ribbon leads 42, on the order of from 15 to 18 thousandths wide by from 3 to 5 thousandths thick, made of Kovar and gold plated for good electrical conduction and glass to metal seal where the metal lead enters the ceramic body of the package. Leads enter a Kovar body through a bead of glass, acting as an insulator. These packages are often circular in configuration, ¼" in diameter with ribbon leads arranged on centers similar to that of the aforementioned flat-packs. The numbers of leads varies from as few as six to as many as 14 or 16 or more. Handling of such extremely small size packages is ordinarily a tweezer-type hand operation requiring endless patience, a high degree of skill and an inordinate amount of time. At best, this is a difficult and relatively inefficient task.

For purposes which will become more apparent as the description proceeds, the leads 42 are or may be slightly crimped into a substantially S-shape as seen at 44, prior to insertion of the flat-pack 40 into the apparatus of the present invention.

The cap member 16 in one embodiment, comprises an open frame work structure 46, of rectangular outline configuration, having oppositely disposed, vertically depending, transverse, flat, rib members 48 extending downwardly from adjacent horizontal ledge extensions 50, integral therewith. The bottom edge 52 of each rib 48 is shaped to provide a series of parallel spaced shallow notches 54 of curved or radial across-section as seen more particularly in FIGURES 1 and 5–7, inclusive. The interconnecting, longitudinal side walls 56 of member 16 are cut away at a slight angle at opposite ends 58, so as to effectively register the same with the sloped or angle walls 22—22 of the base 14. In this manner a container is developed as hereinafter described, for the pressure pad 38 and the flat-pack 40.

The bottom or under surface of the ledges 50 are provided with registering ridges 60 for mating engagement with the ridges 36 of the base 14 when the cap portion is arranged in contact with the base, as seen in FIGURE 1. Along the outer lower (underneath) portion of each ledge 50 there are arranged a plurality of triangular or wedge-shaped gusset-like members 62 each of which is adapted to register with and be received within a respective canted notch 26 of the base member, for purposes to be described herein presently. Solder observation cutouts or notches as well as solder gas relief ports 64 are formed or otherwise provided in the opposite lower end portions of base 14, as seen most clearly in the lower right hand portion of FIGURE 2 and in the right hand portion of FIGURE 1.

When it is desired to employ the present invention with a suitable, flat, rectangular package 40, the members are arranged in the order shown in FIGURE 2 with the compression pad 38 in place on the ledge 18 of the base 14. The flat-pack 40 with its ribbon-like leads 42 crimped as at 44 is then positioned on top of the compression pad 38 after which the cap member is oriented with the ribs 48 over the elongated aperture 24. The cap is then pressed downwardly so that the ribbons 42, now located in the registering notches 26, are progressively deformed downwardly around the radial notches 54 so as to seat within the grooves 34 and 26, respectively. Continued downward pressure ultimately orients the conductive leads in the configuration and arrangement shown in the partial sectional view of FIGURES 1 and 5 in which the cap is now in contact with the base. Suitable dielectric epoxy cement or adhesive may be applied between the interfaces of the cap and the base so that the structure of FIGURE 1 may provide a rigid unitary assembly for further handling. As described herein, the pluggable header has a width of .300 by a length of .500 and is .125 in thickness from the top of integrated circuit flat pack to the bottom of the now assembled header.

Figure 3:
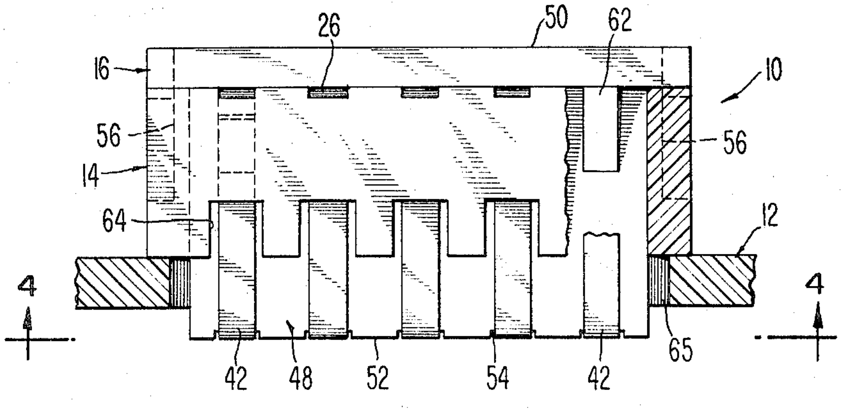
FIGURE 3 is a partial sectional view taken along the line 3—3 of FIGURE 1.
Figure 4:
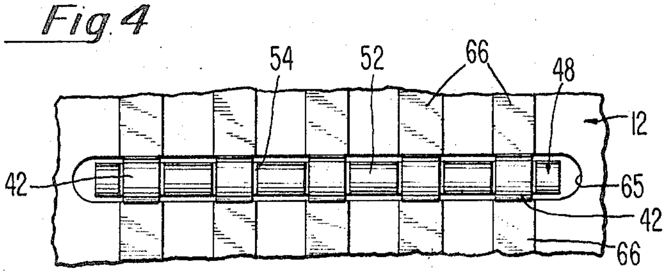
FIGURE 4 is a detail sectional view along the line 4—4 of FIGURE 3 illustrating a portion of the bottom of the structure.
Figure 5:
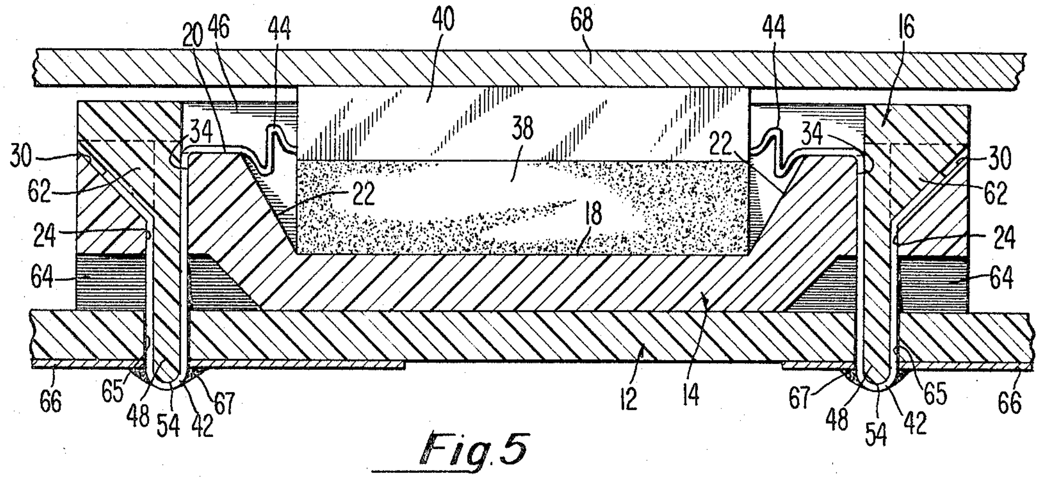
FIGURE 5 is a sectional view taken along the line 5—5 of FIGURE 1.

Ribs 48 are made sufficiently extensive (lengthwise) so that a portion of each rib is capable of extending through an opening 65 in an associated printed wiring panel 12 as seen particularly in FIGURE 1 and in the sectional side elevational view of FIGURES 3 and 5, whereupon interconnection can be made from the ribbon-lead of the flat pack to the associated printed wiring busses 66 of FIGURE 4, of the printed wiring panel 12 as by dip soldering for example. This is shown by the darkened fillets 67 in the appropriate figure. It should be clear from the preceding description, that whereas prior to the employment of the present invention, the flat pack and its flimsy, resilient easily deformable, leads was difficult, bearing on the impossible, to handle. Now, with the encapsulated pluggable header arrangement of the present invention, the unitary assembly thus formed can be readily, operatively associated with all manner of printed wiring assemblies and/or interconnecting plugs and sockets or other type electronic devices.

In certain applications to which the present invention finds employment, it is necessary or desirable to provide not only a shock mounting for the integrated circuitry but also a means for conducting heat away from the assembly. This heat sink, so-called, can be provided on the apparatus of the present invention, by attaching a conductive member 68 which may be arranged in overlaying surface contact with the main body 40 of the integrated circuit assembly, as shown particularly in the sectional view of FIGURE 5. This arrangement has the desirable features of permitting the heat from the assembly to be conducted away quite readily due to the larger mass of the heat sinking member 68, which can, in this case, be a flat metallic plate. (If printed wiring circuit board 12 and member 68 are dimensionally fixed, the pressure pad 38 will assure intimate contact of the integrated circuit assembly to the member 68 for heat dissipation.)

Figure 6:
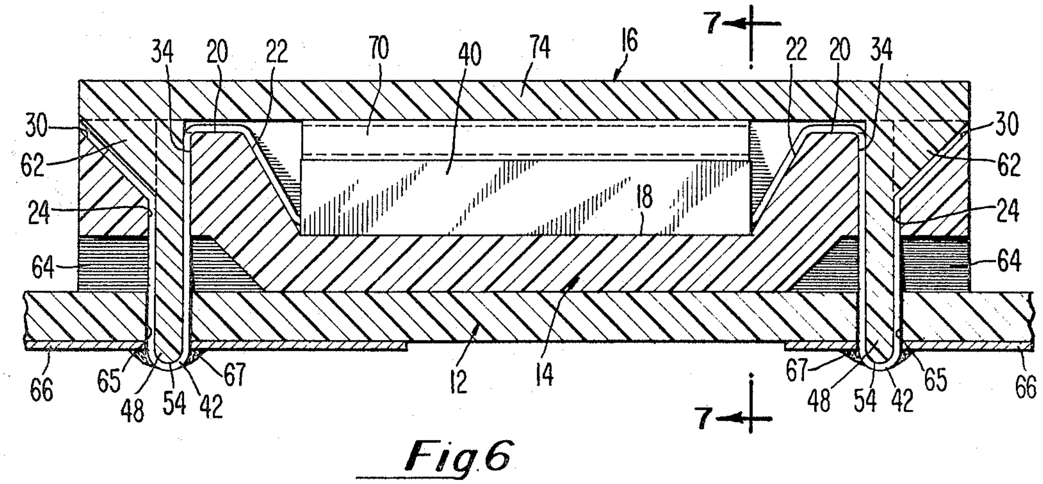
FIGURE 6 is sectional view of a modified form of the invention illustrating an integral cap or cover and associated heat sink for the apparatus.
Figure 7:
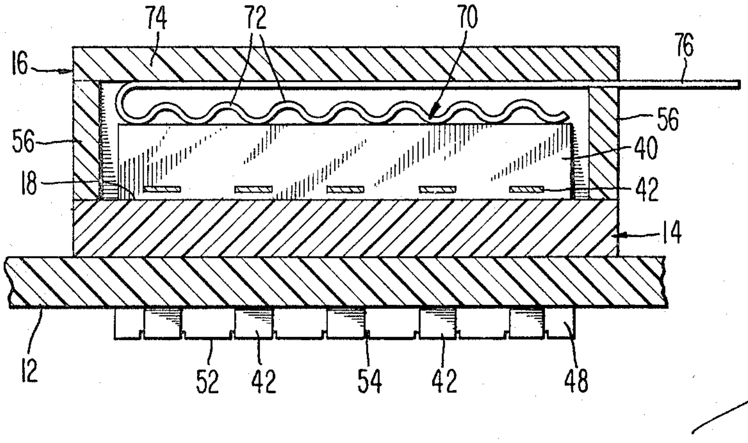
FIGURE 7 is a sectional view along the line 7—7 of FIGURE 6 illustrating the heat sink arrangement in greater detail.

Another arrangement which likewise can provide both shock and impact resistance as well as thermal heat sinking, is that shown in the sectional views of FIGURES 6 and 7. In this embodiment, the flat-pack 40 is arranged on the platform 18 of base 14. A heat conductive member 70, e.g., beryllium copper spring, having a plurality of curved or serpentine bends 72 therein is arranged on the top of the flat pack in contact with the cap member 74. The member 74 is or may be a unitary closure member with the cover portion being integral with the sides and ends.

This modification of the present invention thus provides both a heat sink and a shock and impact resistant effect by means of the single member 70. In this embodiment the conductive spring-like assembly contacts the upper surface of the flat-pack. An extension 76 projecting laterally away therefrom permits interconnection to other and larger heat sinking members, e.g., the wall of a container member. This latter arrangement permits the flat pack to be fairly roughly handled while the combination heat sink and shock absorber absorbs the impacts of dropping, bumping or generally careless handling. The high temperature dielectric, e.g., in the range of 200° C., permits the apparatus to withstand the inordinately high temperatures encountered in space vehicle use.

There has thus been described a novel integrated electronic circuit storing, forming and handling apparatus which provides a simple, relatively inexpensive and efficient package assembly for an otherwise easily deformed and quite often frangible circuit package which heretofore had to be handled extremely carefully in order to avoid damage or breakage while the flat pack was being operably interconnected to the utilization device with which it was to be associated.

What is claimed is:

1. Electronic circuit package storage, forming and handling apparatus comprising:
(a) oppositely disposed rigid high temperature dielectric members each of which includes portions adapted for interfitting nesting engagement with one another,
(b) one of said members acting as a supporting means for receiving an operably associated electronic circuit package thereon having one or more conductive members extending therefrom,
(c) the other of said members acting as a closure and forming means effective when nested with the other of said members to deform and rigidify the conductive members of the circuit package so that the latter may be operably pluggably inserted into and engaged in sliding contact through said supporting member for subsequent connection with other associated electronic circuit apparatus, and
(d) heat sink impact shock absorbing means operably associated with said members and said circuit package effective to dissipate thermal and shock effects enabling said apparatus to be utilized at predetermined levels of operation.

2. Electronic circuit package storage, forming and handling apparatus comprising:
(a) oppositely disposed upper and lower members each of which includes portions adapted for interfitting nesting engagement with one another,
(b) the lower one of said members acting as a support for receiving an operably associated electronic circuit package thereon having one or more conductive lead members extending therefrom,
(c) the upper one of said members acting as a closure and forming means effective when nested with the lower member to deform and rigidify the leads of the associated circuit package so that the latter may be operably pluggably inserted into said support member so as to extend therethrough and be interconnected into other associated apparatus, and
(d) heat sink impact shock absorbing means operably associated with said members and said circuit package and including a projecting portion for interconnection to other apparatus effective to dissipate thermal and shock effects enabling said apparatus to be maintained at a predetermined level of operation.

3. Electronic circuit package storage, forming and handling apparatus comprising:
(a) a pair of oppositely disposed rigid electrically insulating members each of which includes portions adapted for interfitting nesting engagement with one another,
(b) one of said pair of members acting as a supporting means for receiving an operably associated electronic circuit package thereon having one or more conductive members extending therefrom,
(c) the other of said pair of members acting as a closure and forming means effective when nested with the first mentioned member to deform and rigidify said conductive members of the circuit package so that the latter may be operably pluggably inserted into said support member and extend therethrough so as to be engaged with other associated apparatus, and
(d) heat sing impact shock absorbing means operably associated with said members effective to dissipate thermal and shock effects enabling said apparatus to be utilized at predetermined levels of operation.

4. The invention in accordance with claim 3 wherein said last named means comprises a resilient spring-like member.

5. Electronic circuit package storage, forming and handling apparatus comprising:
(a) a first high temperature dielectric member provided with a central planar area for receiving an electronic circuit package thereon and oppositely disposed parallel spaced grooves,
(b) a second high temperature dielectric member having a central open area and oppositely disposed depending projections for interfitting engagement with the parallel grooves of said first member,
(c) said first member further including a plurality of inspection and gas relief apertures at opposite ends thereof opening into respective ones of said spaced grooves,
(d) said first and second member also including means effective to bend and form the flexible conductive leads extending from an electronic circuit package disposed on said planar area whereby said leads are formed into substantially rigid prong-like connectors for operable association with other associated circuit apparatus, and
(e) heat sink and impact shock absorbing means operably associated with said first and second members and said circuit package effectively enabling said apparatus to be handled, stored, assembled and transported without risk of damage thereto.

6. The invention in accordance with claim 5 wherein said last named means comprises a beryllium copper strip of serpentine configuration.

7. Electronic circuit package storage, forming and handling apparatus comprising:
(a) oppositely disposed upper and lower members each of which includes portions adapted for interfitting nesting engagement with one another,
(b) the lower one of said members acting as a support for receiving an operably associated electronic circuit package thereon having one or more conductive lead members extending therefrom,
(c) said lower members being provided with oppositely disposed transverse parallel apertures, a plurality of parallel spaced grooves for receiving the leads of said package extending into each of said apertures at right angles thereto,
(d) the upper one of said members acting as a closure and forming means for said apparatus,
(e) said upper member further including oppositely disposed depending integral transverse projections the root portions of each one of which includes means interfitting with said spaced grooves and effective when nested with said lower member to entrap, deform and rigidify the leads of the associated circuit package so that the latter may be operably pluggably interconnected into other associated apparatus, (f) heat sink means operably associated with said circuit package, (g) impact shock absorbing means operably associated with said members and said circuit package, said latter means being effective to dissipate thermal and shock effects enabling said apparatus to be maintained at a predetermined level of operation.

8. The invention in accordance with claim 7 wherein said shock absorbing means comprises a foamed plastic material of sufficient resilience and compliance to adequately absorb the shock encountered in the environment in which the apparatus is employed.

9. Electronic circuit package storage, forming and handling apparatus comprising:

(a) oppositely disposed rigid high temperature dielectric members each of which includes portions adapted for interfitting nesting engagement with one another, (b) one of said members acting as a supporting means for receiving an associated electronic circuit package thereon, (c) an electronic circuit package disposed on said supporting means and having a plurality of electrical lead conductors extending away therefrom, (d) the other of said members acting as a closure and forming means effective when nested with other of said members to deform and rigidify the conductive members of said circuit package so that the latter may be operably pluggably inserted into and through said support member to be engaged with other associated electronic circuit apparatus, (e) heat sink means coextensive with said closure member, and (f) impact shock absorbing means operably associated with at least one of said members and said circuit package, said heat sink and shock absorbing means being effective to dissipate thermal and shock effects enabling said apparatus to be utilized at predetermined levels of operation.

References Cited

UNITED STATES PATENTS

| | | | |
|---|---|---|---|
| 2,807,659 | 3/1957 | Woods | 339—112 X |
| 2,888,658 | 5/1959 | Welch | 339—174 X |
| 3,008,113 | 11/1961 | Johnson | 339—17 |
| 3,079,132 | 2/1963 | Tiegel | 339—93 X |
| 3,164,750 | 1/1965 | Miller | 339—17 X |
| 3,184,699 | 5/1965 | Spera | 339—17 |
| 3,261,904 | 7/1966 | Wulc. | |
| 3,293,590 | 12/1966 | Woolsey | 339—192 |
| 3,297,974 | 1/1967 | Pittman | 339—17 |

MARVIN A. CHAMPION, *Primary Examiner.*

ROBERT K. SCHAEFER, W. DONALD MILLER, *Examiners.*

R. S. MACON, JOHN R. MOSES, *Assistant Examiners.*